US011127649B2

(12) United States Patent
Shimizu (10) Patent No.: US 11,127,649 B2
(45) Date of Patent: Sep. 21, 2021

(54) ELECTRONIC APPARATUS

(71) Applicant: Toshiba Memory Corporation, Minato-ku (JP)

(72) Inventor: Keishi Shimizu, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 174 days.

(21) Appl. No.: 16/522,995

(22) Filed: Jul. 26, 2019

(65) Prior Publication Data

US 2020/0235025 A1 Jul. 23, 2020

(30) Foreign Application Priority Data

Jan. 23, 2019 (JP) .............................. JP2019-009405

(51) Int. Cl.
| H05K 5/00 | (2006.01) |
| H01L 23/367 | (2006.01) |
| G11C 5/06 | (2006.01) |
| H05K 5/02 | (2006.01) |

(52) U.S. Cl.
CPC .............. *H01L 23/367* (2013.01); *G11C 5/06* (2013.01); *H05K 5/0069* (2013.01); *H05K 5/0217* (2013.01); *H05K 2201/10159* (2013.01)

(58) Field of Classification Search
CPC ................... H01L 23/367; G11C 5/06; H05K 2201/10159; H05K 7/20481; H05K 5/0069; H05K 5/0217
See application file for complete search history.

(56) References Cited

U.S. PATENT DOCUMENTS

| 8,665,596 | B2 | 3/2014 | Brereton | |
| 2012/0169257 | A1 | 7/2012 | Brereton | |
| 2016/0270261 | A1 | 9/2016 | Matsuda et al. | |
| 2016/0293513 | A1 | 10/2016 | Hiruta | |
| 2016/0307818 | A1 | 10/2016 | Kawase et al. | |
| 2018/0049331 | A1 | 2/2018 | Voss et al. | |
| 2018/0151469 | A1* | 5/2018 | Chen | H01L 23/42 |
| 2018/0184537 | A1* | 6/2018 | Wang | H05K 1/141 |
| 2020/0343155 | A1* | 10/2020 | Kiyonaga | H05K 7/209 |

FOREIGN PATENT DOCUMENTS

| CN | 102595785 A | 7/2012 |
| CN | 207151077 U | 3/2018 |
| JP | 2016-167571 A | 9/2016 |
| JP | 2016-192444 A | 11/2016 |
| JP | 2016-207785 A | 12/2016 |
| TW | M511185 U | 10/2015 |

\* cited by examiner

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

An electronic apparatus includes a first board, a second board, a housing, and a first thermal conductive assembly. The housing accommodates the first board and the second board. The first thermal conductive assembly connects a face of the first board, the face of the first board fronting a region between the first board and the second board, to a first face of the housing or a second face of the housing. The first face is opposed to the first board, the second face is opposed to the second board.

13 Claims, 10 Drawing Sheets

ELECTRONIC APPARATUS

CROSS-REFERENCE TO RELATED APPLICATIONS

This application is based upon and claims the benefit of priority from Japanese Patent Application No. 2019-9405, filed on Jan. 23, 2019; the entire contents of which are incorporated herein by reference.

FIELD

Embodiments described herein generally relate to an electronic apparatus.

BACKGROUND

An electronic apparatus, which includes a package containing a nonvolatile memory and a package containing a controller for controlling the nonvolatile memory mounted on a single board and a housing accommodating the board, is known. In such an electronic apparatus, the packages are connected to the housing by heat dissipation members to dissipate heat from the packages.

In contrast, another electronic apparatus, which includes a package containing a nonvolatile memory and a package containing a controller for controlling nonvolatile memories mounted on a first board, packages each containing a nonvolatile memory mounted on a plurality of second boards, and a housing accommodating the first board and the second boards that are stacked, is also known. In such an electronic apparatus, heat dissipation is insufficient for heat generated on mounting faces of boards among the first board and the second boards, which do not front the housing.

DETAILED DESCRIPTION

In general, according to one embodiment, an electronic apparatus includes a first board, a second board, a housing, and a first thermal conductive assembly. The housing accommodates the first board and the second board. The first thermal conductive assembly connects a face of the first board, the face of the first board fronting a region between the first board and the second board, to a first face of the housing or a second face of the housing. The first face is opposed to the first board, the second face is opposed to the second board.

Exemplary embodiments of an electronic apparatus will be explained below in detail with reference to the accompanying drawings. The present invention is not limited to the following embodiments.

First Embodiment

Figure 1:
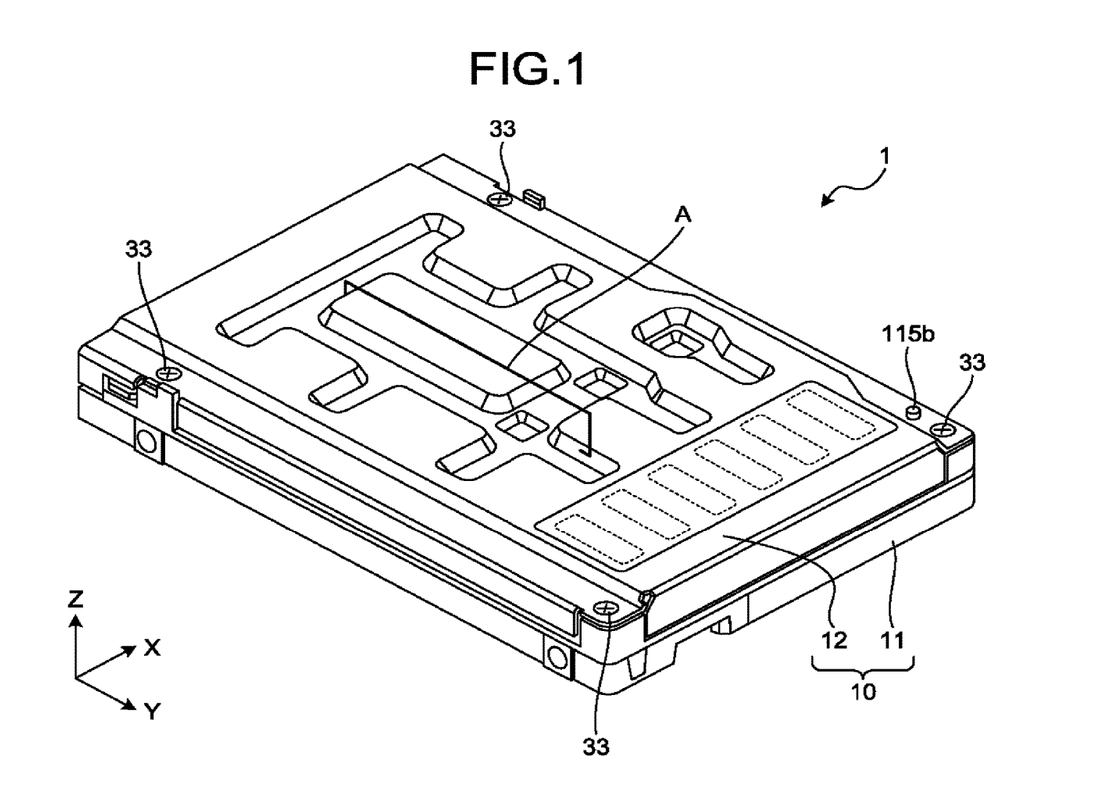
FIG. 1 is a perspective view illustrating an appearance configuration example of an electronic apparatus according to a first embodiment.
Figure 2:
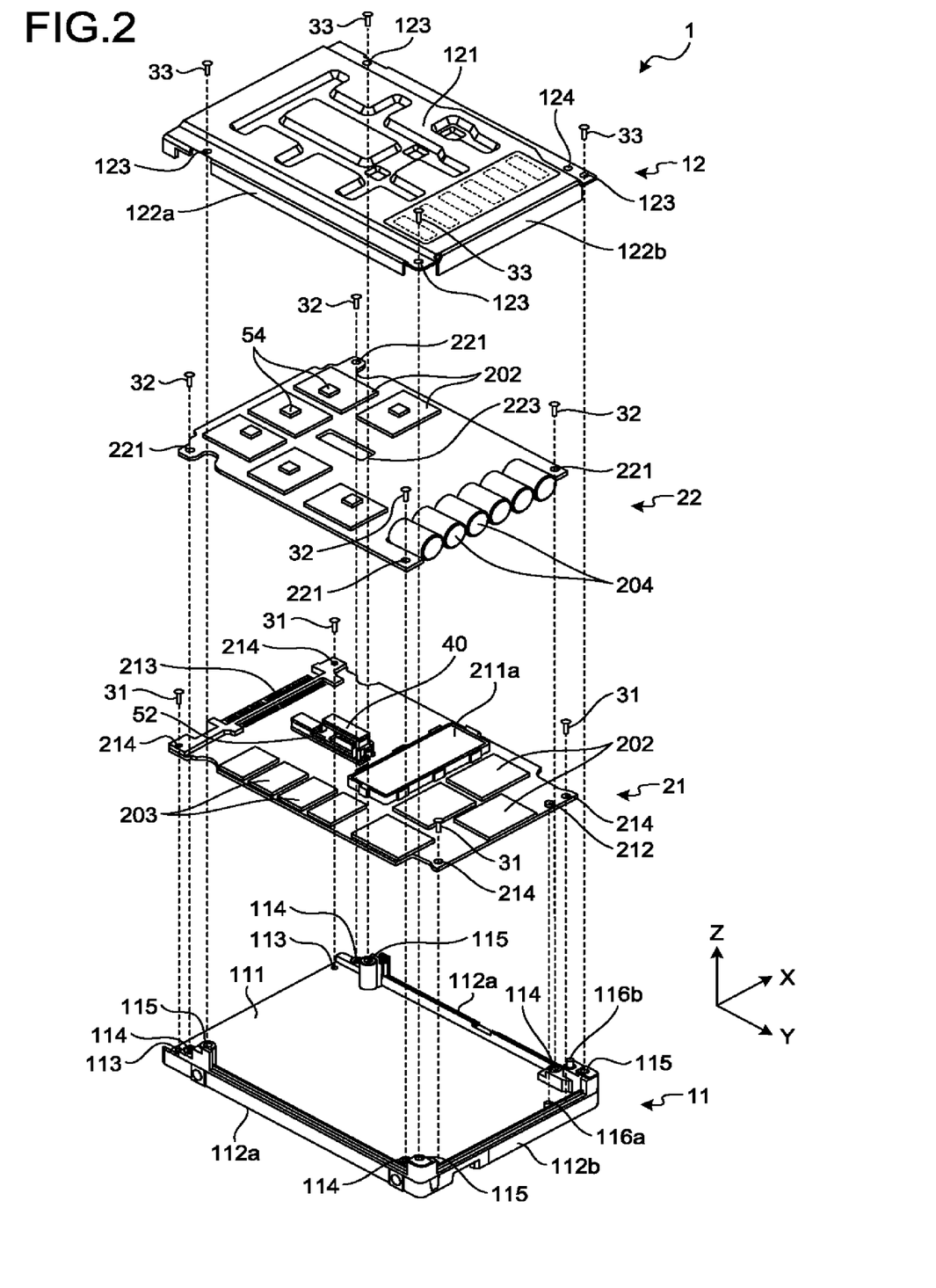
FIG. 2 is an exploded perspective view illustrating an example of the electronic apparatus according to the first embodiment.
Figure 3:
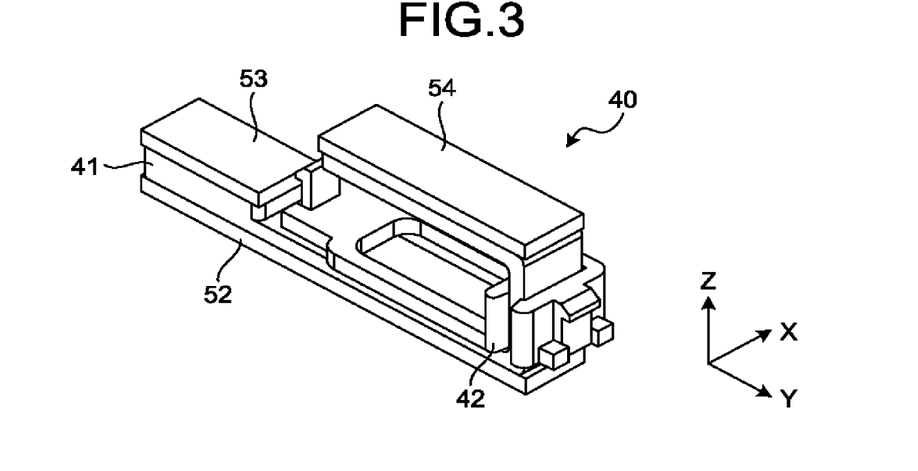
FIG. 3 is a perspective view illustrating a configuration example of a thermal conductive assembly.
Figure 4A:
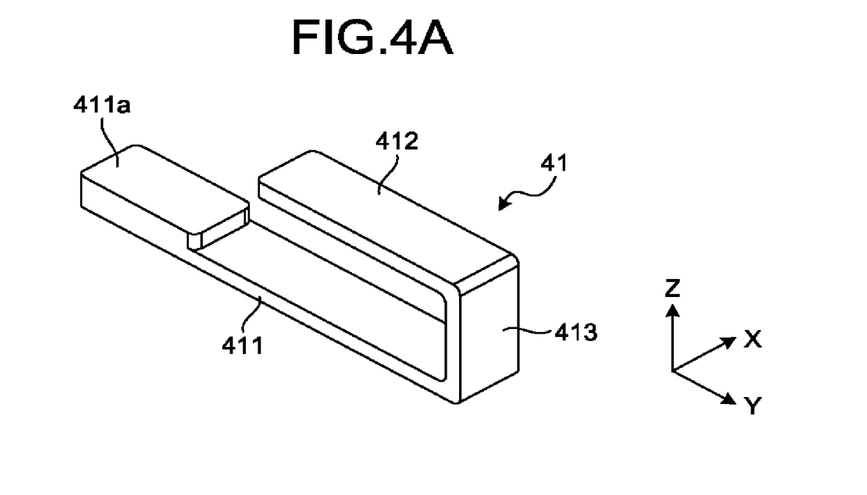
FIGS. 4A and 4B are perspective views illustrating an example of members that constitute the thermal conductive assembly.
Figure 4B:
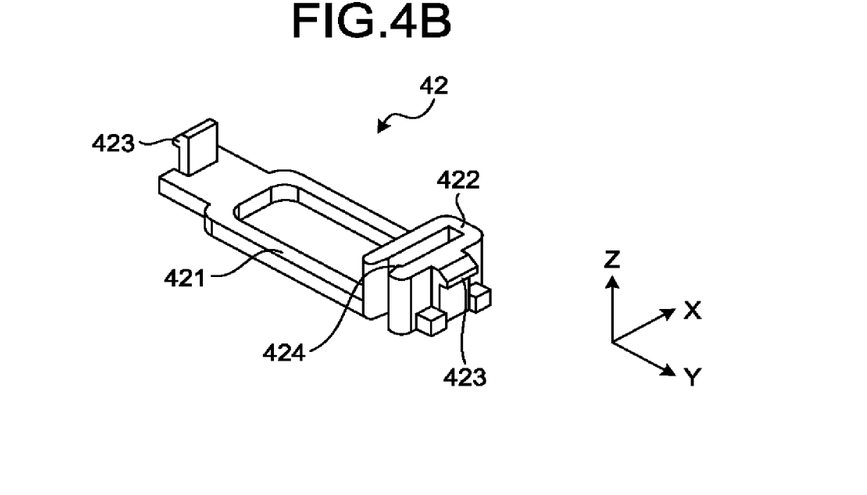
Figure 5:
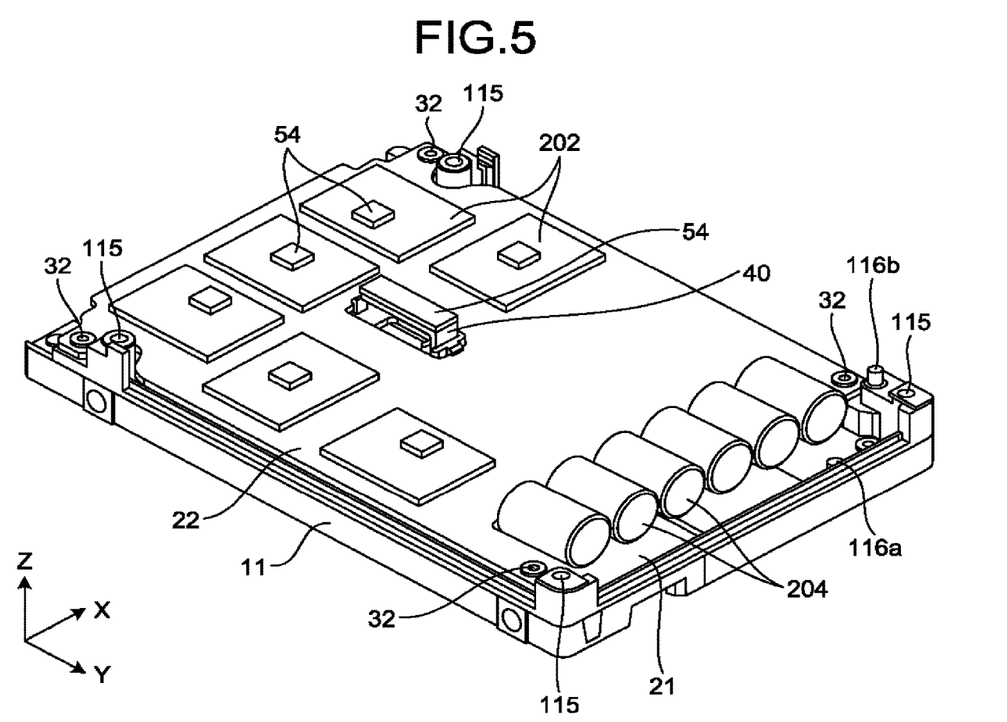
FIG. 5 is a perspective view illustrating an internal configuration example of the electronic apparatus according to the first embodiment.
Figure 6:
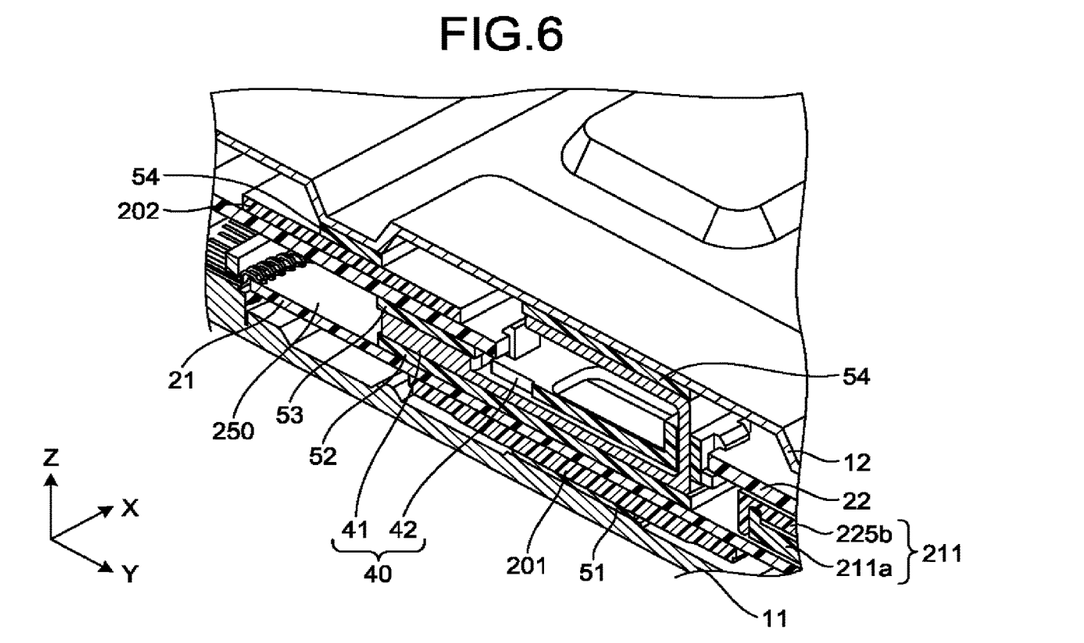
FIG. 6 is a partial sectional perspective view of a region A of FIG. 1.

FIG. 1 is a perspective view illustrating an appearance configuration example of an electronic apparatus according to a first embodiment. FIG. 2 is an exploded perspective view illustrating an example of the electronic apparatus according to the first embodiment. FIG. 3 is a perspective view illustrating a configuration example of a thermal conductive assembly. FIGS. 4A and 4B are perspective views illustrating an example of members that constitute the thermal conductive assembly. FIG. 5 is a perspective view illustrating an internal configuration example of the electronic apparatus according to the first embodiment. FIG. 6 is a partial sectional perspective view of a region A of FIG. 1.

Hereinafter, the electronic apparatus 1 will be exemplified by a solid state drive (SSD) that includes nonvolatile memories as storage media. Hereinafter, for the sake of convenience, it is assumed that the latitudinal direction of the rectangular top wall or bottom wall of the electronic apparatus 1 is an X-direction, its longitudinal direction is a Y-direction, and its thickness direction is a Z-direction. Relative positional relations of components arranged in the Z-direction, i.e., their relations in the vertical direction, will be illustrated, by using as a reference arrangement state of the electronic apparatus 1 illustrated in FIGS. 1 and 2. A face oriented to the positive side in the Z-direction will be referred to as "upper face", and a face oriented to the negative side in the Z-direction will be referred to as "lower face".

The electronic apparatus 1 has a flat rectangular parallelepiped shape as its appearance. The electronic apparatus 1 includes a housing 10 having a hollow rectangular parallelepiped shape, and two or more boards 21 and 22 accommodated in the housing 10.

The housing 10 includes a base 11 and a cover 12. The base 11 includes a plate-like bottom wall 111, and lateral walls 112a and 112b extending upward in the Z-direction perpendicularly from the outer periphery of the bottom wall 111. In this example, the base 11 is provided with a pair of lateral walls 112a each having a surface perpendicular to the X-direction, and a single lateral wall 112b arranged at one end in the Y-direction and having a surface perpendicular to the Y-direction.

The lateral walls 112a are provided with screw holes 114 and 115 extending in the Z-direction. The thickness of the lateral walls 112a is larger at portions formed with the screw holes 114 and 115 than at the other portions. The screw holes 114 are provided to fix the board 22 inside the housing 10 by screws 32. The screw holes 115 are provided to fix the cover 12 to the base 11 by screws 33. In this example, the screw holes 114 and 115 are arranged near the both ends of the lateral walls 112a in the Y-direction. In the Z-direction, the arrangement positions of the screw holes 114 are lower than the arrangement positions of the screw holes 115.

The bottom wall 111 of the base 11 is provided with screw holes 113. The screw holes 113 are provided to fix the board 21 inside the housing 10 by screws 31. Further, the bottom wall 111 of the base 11 is provided with a pin 116a projected upward in the Z-direction on the bottom wall 111. The pin 116a is provided to position the boards 21 and 22 in the X-direction and the Y-direction with respect to the base 11. Accordingly, the board 21 arranged on the lowermost side is provided with a through hole 212 for inserting this pin 116a therein, at a corresponding position. In the example illustrated here, the pin 116a is provided only at one position, but a plurality of pins 116a may be provided on the bottom wall 111.

One of the lateral walls 112a is provided with a pin 116b projected upward in the Z-direction (i.e., toward the cover 12). In this example, the pin 116b is illustrated as being arranged near one of the screw holes 115 provided in the lateral walls 112a. The pin 116b is provided to position the cover 12 in the X-direction and Y-direction with respect to the base 11, when the cover 12 is to be put over the base 11. Accordingly, the cover 12 is provided with a through hole 124 for inserting this pin 116b therein, at a corresponding position. In the example illustrated here, the pin 116b is provided only at one position, but a plurality of pins 116b may be provided on the lateral walls 112a and 112b.

The cover 12 includes a plate-like top wall 121, and lateral walls 122a and 122b extending downward in the Z-direction perpendicularly from the outer periphery of the top wall 121. In this example, the cover 12 is provided with a pair of lateral walls 122a each having a surface perpendicular to the X-direction, and a pair of lateral walls 122b each having a surface perpendicular to the Y-direction.

The bottom wall 111 of the base 11 and the top wall 121 of the cover 12 are provided with thermal interface materials 51 and 54 at predetermined positions. Each of the thermal interface materials 51 and 54 is made of an acrylic resin or silicone resin, for example, and has thermally conductive and electrically insulating properties, together with elasticity. The thermal interface materials 51 and 54 are provided to conduct heat, which is generated by devices mounted on the boards 21 and 22, to the base 11 and the cover 12, to suppress a rise in temperature inside the housing 10. Accordingly, the thermal interface materials 51 are arranged in contact with devices on the lower face of the board 21 and with the bottom wall 111 of the base 11. The thermal interface materials 54 are arranged in contact with devices on the upper face of the board 22 and with the top wall 121 of the cover 12.

The cover 12 is provided with through holes 123 for inserting the screws 33 therein, and a through hole 124 for inserting the pin 116b therein. The through holes 123 are arranged at the positions corresponding to the screw holes 115 of the base 11. Further, the through hole 124 is arranged at the position corresponding to the pin 116b of the base 11.

Each of the base 11 and the cover 12 that constitute the housing 10 is formed of an aluminum die cast product, aluminum sheet-metal product, or the like, which has a property high in heat dissipation. Here, as illustrated in FIGS. 1 and 2, the lateral walls 112a and 112b of the base 11 and the lateral walls 122a and 122b of the cover 12 that constitute the housing 10 are not provided with any ventilation hole.

Each of the boards 21 and 22 includes a printed circuit board on which devices are mounted. The devices are circuit components, such as a controller 201, nonvolatile memories 202 and volatile memories 203, each in a packaged form, and capacitors 204. Each of the nonvolatile memories 202 is structured such that a nonvolatile semiconductor memory chip including a NAND type flash memory, for example, is packaged by heat resistant resin, ceramics, or the like. Each of the volatile memories 203 is structured such that a dynamic random access memory (DRAM) chip or a static RAM (SRAM) chip is packaged by heat resistant resin, ceramics, or the like. The controller 201 is structured such that a controller chip for controlling the nonvolatile memories 202 and the volatile memories 203 is packaged by heat resistant resin, ceramics, or the like. The controller chip is formed of a system-on-a-chip (SoC), for example. The capacitors 204 serve to supplement the supply of power from a host apparatus to which the electronic apparatus 1 is connected.

The controller 201 serves to control data exchange with the host apparatus. Specifically, upon receiving a data write command from the host apparatus, the controller 201 temporarily stores data to be written, into a write buffer provided in the volatile memories 203, and writes the data in the write buffer into a position inside the nonvolatile memories 202 that corresponds to an address specified by the write command. Further, upon receiving a data read command from the host apparatus, the controller 201 reads data from a position inside the nonvolatile memories 202 that corresponds to an address specified by the read command, and temporarily stores the read data into a read buffer provided in the volatile memories 203. Then, the controller 201 sends the data stored in the read buffer to the host apparatus.

Each of the devices is mounted on at least one of the two faces of each of the boards 21 and 22 by, for example, surface mounting or the like. In the example illustrated in FIGS. 2 and 6, the controller 201 is disposed on the lower face of the board 21 on the lower side, and some of the nonvolatile memories 202 and the volatile memories 203 are disposed on the upper face of the board 21. Further, some of the nonvolatile memories 202 and the capacitors 204 are disposed on the upper face of the board on the upper side. Although not illustrated, some devices are disposed on the lower face of the board 22 on the upper side.

In addition to the devices, the boards 21 and 22 include board-to-board connectors 211, each of which forms electrical connection to the other board stacked in the Z-direction. The board-to-board connectors 211 are mounted on the respective boards 21 and 22 by surface mounting. The board-to-board connectors 211 are arranged at positions that are opposed to each other when the boards 21 and 22 are stacked in an aligned state. As illustrated in FIG. 6, the board-to-board connectors 211 are composed of a male type connector 211a on one side and a female type connector 225b on the other side, which can be mutually fitted in to achieve electrical connection between the boards 21 and 22. When the boards 21 and 22 are mutually connected by the board-to-board connectors 211, the boards 21 and 22 are relatively firmly connected to each other.

The board 21 arranged on the lower side is provided with the male type connector 211a on the upper face. The board 22 arranged on the upper side is provided with the female type connector 225b on the lower face. Further, the board 21 on the lower side is provided with a connector 213 at one end in the Y-direction, which can be electrically connected to the external host apparatus. As a standard of connecting with the host apparatus, for example, Peripheral Component Interconnect express (PCIe) or Serial Attached Small Computer System Interface (SAS) is used.

The board 21 arranged on the lower side is provided with the through hole 212 corresponding to the pin 116a provided on the bottom wall 111 of the base 11. Further, the board 21 is provided with through holes 214 for inserting the screws 31 therein to fix the board 21 to the base 11. These through holes 214 are arranged correspondingly to the screw holes 113 of the base 11. The board 22 is provided with through holes 221 for inserting the screws 32 therein that fix the hoard 22 to the base 11. These through holes 221 are arranged correspondingly to the screw holes 114 of the lateral walls 112a of the base 11.

In this embodiment, as describe later, a thermal conductive assembly 40 is provided that thermally connects the upper face of the board 21 and the lower face of the board 22, which front an inter-board region 250 between the board 21 and the board 22, to the top wall 121 of the cover 12. As the thermal conductive assembly 40 is arranged in uch a way that it passes through part of the board 22, the board 22 on the upper side is provided with an opening 223 at this part. The opening 223 is formed at a position where there is no device disposed on the board 22. The position of the opening 223 may be changed, depending on the positions of devices to be mounted. The opening 223 is preferably arranged at about the center of the board 22. However, the opening 223 may be arranged near the position corresponding to a device which generates larger amount of heat during operation, among the devices disposed on the upper face of the board 21 on the lower side or the lower face of the board 22 or the upper side.

The thermal conductive assembly 40 is pressed and attached between the upper face of the board 21 on the lower side and the lower face of the top wall 121 of the cover 12. Specifically, the thermal conductive assembly 40 is provided at a region including the position of the opening 223, and thermally connects the upper face of the board 21 on the lower side and the lower face of the board 22 on the upper side to the lower face of the top wall 121 of the cover 12. As illustrated in FIG. 3, the thermal conductive assembly 40 includes a thermal conductive element 41 having a hook shape, and a fixing part 42 that secures the thermal conductive element 41 to the board 22 on which the opening 223 is formed.

As illustrated in FIG. 4A, the thermal conductive element 41 includes a first contact portion 411, a second contact portion 412, and a connecting portion 413. The first contact portion 411 is set in contact with at least one of the upper face of the board 21 and the lower face of the board 22 through thermal interface materials 52 and 53. The second contact portion 412 is set in contact with the lower face of the top wall 121 of the cover 12 through a thermal interface material 54. The connecting portion 413 connects one end of the first contact portion 411 to one end of the second contact portion. The first contact portion 411 and the second contact portion 412 are arranged substantially in parallel with each other. The size of the second contact portion 412 is set to a size that can pass through the opening 223. For example, the size of the second contact portion 412 is set slightly smaller than the size of the opening 223. The height of the connecting portion 413 is substantially equal to the distance between the upper face of the board 21 and the lower face of the top wall 121 of the cover 12.

The first contact portion 411 is provided on part of the upper face with a projected portion 411a projected upward. As illustrated in FIGS. 3 and 6, the upper face of the projected portion 411a is set in contact with the lower face of the board 22 through the thermal interface material 53. The height of the projected portion 411a is substantially equal to the distance that should be kept between the upper face of the board 21 and the lower face of the board 22. The thermal conductive element 41 configured as described above is made of a material, such as copper, which has high thermal conductivity. Alternatively, the thermal conductive element 41 may be formed of a heat pipe that includes a hollow pipe having a capillary structure on the inner wall and made of a material having high thermal conductivity, and an operating fluid, such as water, encapsulated in the pipe.

As illustrated in FIG. 4B, the fixing part 42 includes a base portion 421, a holding portion 422 to hold the connecting portion 413 of the thermal conductive element 41, and a plurality of engaging portions 423, which are projected in the Z-direction, provided near one end of the base portion 421. The base portion 421 is placed on the upper face of the first contact portion 411, and the connecting portion 413 of the thermal conductive element 41 is pinched and held by the holding portion 422, so that the fixing part 42 is fixed to the thermal conductive element 41. The holding portion 422 is provided with a small barb 424 on one side of an insertion slot for the connecting portion 413 of the thermal conductive element 41. This barb 124 is provided to prevent the thermal conductive element 41 from easily coming off the fixing part 42 in the X-direction. The engaging portions 423 have a snap-fit structure. In this example, in order to fix the thermal conductive assembly 40 to the board 22 at the end in the Y-direction of the opening 223 formed in the board 22, the engaging portions 423 are provided in accordance with the width of the opening 223 in the Y-direction. As the engaging portions 423 having the snap-fit structure are inserted into the opening 223 of the board 22, the thermal conductive assembly 40 is fixed to the board 22.

In this example, as illustrated in FIG. 6, the thermal conductive assembly 40 is provided such that the reverse side of the controller 201, which is disposed on the lower face of the board 21 and generates a large amount of heat, is connected to the cover 12.

Next, an explanation will be given of an example of an assembling method of the electronic apparatus 1 described above, with reference to FIGS. 2, 5, and 6. First, the thermal interface materials 51 are attached to predetermined positions on the lower face of the board 21. Then, as illustrated in FIG. 2, while aligning the position of the through hole 212 of the board 21 with the position of the pin 116a of the base 11, the board 21 is put on the base 11. In this state, the board 21 is fixed to the base 11. Specifically, the screws 31 used as fixing means are inserted through the through holes 214 of the board 21, and are fastened into the screw holes 113 of the base 11 to fix the board 21.

Then, the thermal conductive assembly 40 is attached to the board 22 such that the second contact portion 412 of the thermal conductive element 41 is present at the position corresponding the opening 223 of the board 22. Thereafter, the board 21 and the board 22 are joined to each other by the board-to-board connectors 211a and 225b. Here, on the thermal conductive element 41, the lower face of the first contact portion 411 is connected to the upper face of the board 21 through the thermal interface material 52, and the upper face of the projected portion 411a is connected to the lower face of the board 22 through the thermal interface material 53.

Thereafter, the board 22 is fixed to the base 11. Specifically, the screws 32 used as fixing means are inserted through the through holes 221 of the board 22, and are fastened into the screw holes 114 of the base 11 to fix the board 22. This state is illustrated in FIG. 5.

Each of the thermal interface materials 51 to 54 has elasticity higher than those of the housing 10, the devices, such as the controller 201 and the nonvolatile memories 202, and the thermal conductive element 41. Accordingly, when the board 22 is fixed to the base 11 by the screws, the thermal interface materials 51 between the base 11 and the board 21 are elastically compressed between the base 11 and the board 21, and thus are set in close contact with the base 11 and the board 21.

Similarly, the thermal interface materials 52 and 53 between the first contact portion 411 of the thermal conductive element 41 and the boards 21 and 22 are elastically compressed between the first contact portion 411 and the board 21 and between the first contact portion 411 and the board 22, respectively. As a result, the thermal interface material 52 is set in close contact with the first contact portion 411 and the board 21, and the thermal interface material 53 is set in close contact with first contact portion 411 and the board 22.

Thereafter, the thermal interface materials 54 are stuck to predetermined positions on the upper face of the board 22. For example, the thermal interface materials 54 are stuck to the nonvolatile memories 202 disposed on the upper face of the board 22. Then, as illustrated in FIG. 2, while aligning the pin 116a provided on the base 11 to be inserted into the through hole 124 of the cover 12, the cover 12 is put over the base 11. Then, the cover 12 is fixed to the base 11 by fixing means, such as the screws 33. Specifically, the screws 33 are inserted through the through holes 123 provided on the cover 12, and are fastened into the screw holes 115 provided on the lateral walls 112a of the base 11 to fix the cover 12.

When the cover 12 is fixed to the base, the thermal interface material 54 between the cover 12 and the upper face of the second contact portion 412 of the thermal conductive element 41 is elastically compressed between the cover 12 and the second contact portion 412. As a result, the thermal interface material 54 is set in close contact with the second contact portion 412 and the cover 12. With the procedures described above, the electronic apparatus 1 is assembled with the appearance illustrated in FIG. 1.

As illustrated in FIG. 6, the devices disposed on the lower face of the board 21 and the devices disposed on the upper face of the board 22 are respectively connected to the base 11 and the cover 12 through the thermal interface materials 51 and 54. Accordingly, even if the amount of heat generated from the devices is large, the heat can be dissipated through the thermal interface materials 51 and 54, and to outside from the housing 10.

In contrast, the upper face of the board 21 and the lower face of the board 22 do not have routes to directly dissipate heat to the housing. In consideration of this, in the first embodiment, the board 22 is provided with the opening 223, at which the thermal conductive assembly 40 is arranged in a state that the thermal conductive element 41 is fixed to the board 22 by the fixing part 42. The thermal conductive element 41 includes the first contact portion 411 that is connected to the upper face of the board 21 and the lower face of the board 22 through the thermal interface materials 52 and 53 in the inter-board region 250, and the second contact portion 412 that is connected to the top wall 121 of the cover 12 through the thermal interface material 54. Consequently, heat from the devices mounted on the boards 21 and 22 is transferred through the boards 21 and 22 and further through the thermal conductive element 41 to the cover 12 of the housing 10, and is dissipated to outside from the housing 10.

For example, as illustrated in FIG. 6, in the case of the controller 201 large in heat generation amount, heat therefrom is also transferred to the reverse side (upper face side) of the board 21 on which the controller 201 is mounted. Accordingly, the first contact portion 411 is arranged on the reverse side of the mounting position of the controller 201, so that heat conducted to the upper face of the board 21 can be easily dissipated to outside.

According to the first embodiment, the electronic apparatus 1, in which a plurality of boards 21 and 22 with devices mounted thereon are arranged and accommodated in the housing 10, is provided with the thermal conductive assembly 40 that connects the faces of boards 21 and 22, which front the inter-board region 250, to the housing 10. The board 22 is provided with the opening 223 at a position where the thermal conductive assembly 40 passes through. Consequently, a route is formed to cause heat conducted to the boards 21 and 22, which front the inter-board region 250, to be dissipated to outside from the housing 10, and thus heat from the mounting faces of the boards 21 and 22 inside the electronic apparatus 1 can be thermally conducted and dissipated. As a result, it is possible to improve cooling performance of the electronic apparatus 1 as a whole, and to achieve a decrease of temperature of the electronic apparatus 1.

In contrast, an electronic apparatus is known in which a housing 10 is provided with ventilation holes to create air flows between the outside and inside of the housing 10. In this case, dust could come into the housing 10 through the ventilation holes and cause malfunction. Further, in a case where the electronic apparatus is arranged inside a server system, a cooling effect cannot be obtained unless the direction of air flows in the server system is toward the ventilation holes of the electronic apparatus. However, in the case of the electronic apparatus 1 according to the first embodiment, cooling inside the housing 10 can be achieved even if the housing 10 is not provided with ventilation holes.

Second Embodiment

Figure 7:
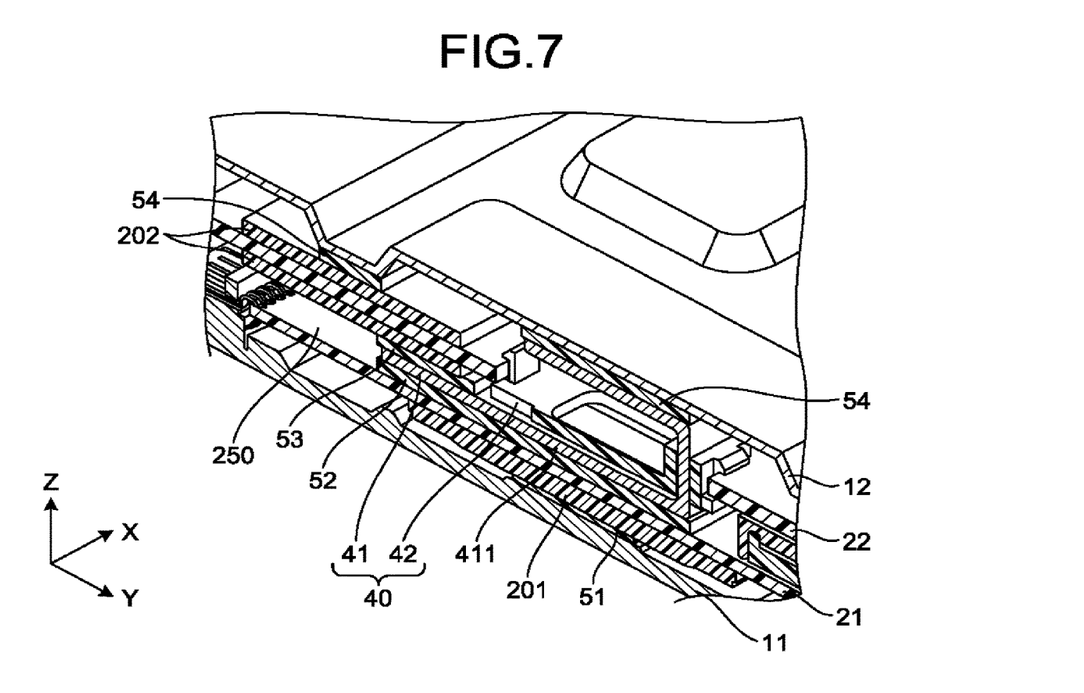
FIG. 7 is a partial sectional perspective view of an electronic apparatus according to a second embodiment.

FIG. 7 is a partial sectional perspective view of an electronic apparatus according to a second embodiment. Here, the constituent elements corresponding to those of the first embodiment are denoted by the same reference symbols, and their description will be omitted. In the first embodiment, as illustrated in FIG. 6, there is no device, such as one of the nonvolatile memories 202 or the volatile memories 203, mounted at the arrangement position of the thermal conductive assembly 40 in the inter-board region 250. Accordingly, the first contact portion 411 of thermal conductive element 41 is arranged in contact with the upper face of the board 21 and the lower face of the board 22 through the thermal interface materials 52 and 53, respectively.

In contrast, in the second embodiment, a device, such one of the nonvolatile memories 202, is mounted on the lower face of the board 22 at the arrangement position of the thermal conductive assembly 40. In this case, the first contact portion 411 of the thermal conductive element 41 is set in contact with the upper face of the board 21 through the thermal interface material 52, and is set in contact with this nonvolatile memory 202 through the thermal interface material 53 on the lower face of the board 22.

In the first embodiment, the first contact portion 411 of the thermal conductive element 41 is provided with the projected portion 411a having a height that substantially corresponds to the distance between the upper face of the board 21 and the lower face of the board 22. In the second embodiment, the projected portion 411a is not provided. Specifically, the thickness of the first contact portion 411 substantially corresponds to the distance between the upper face of the board 21 and the device mounted on the lower face of the board 22.

As illustrated in FIG. 7, as the thermal conductive assembly 40 is set in contact with the lower face of the device mounted on the lower face of the hoard 22, heat from the device is conducted through the thermal interface material 53, the thermal conductive element 41 of thermal conductive assembly 40, the thermal interface materials 54, and the top wall 121 of the cover 12, and is dissipated to outside from the housing 10.

In the second embodiment, an effect substantially the same as that of the first embodiment can also be obtained.

Third Embodiment

Figure 8:
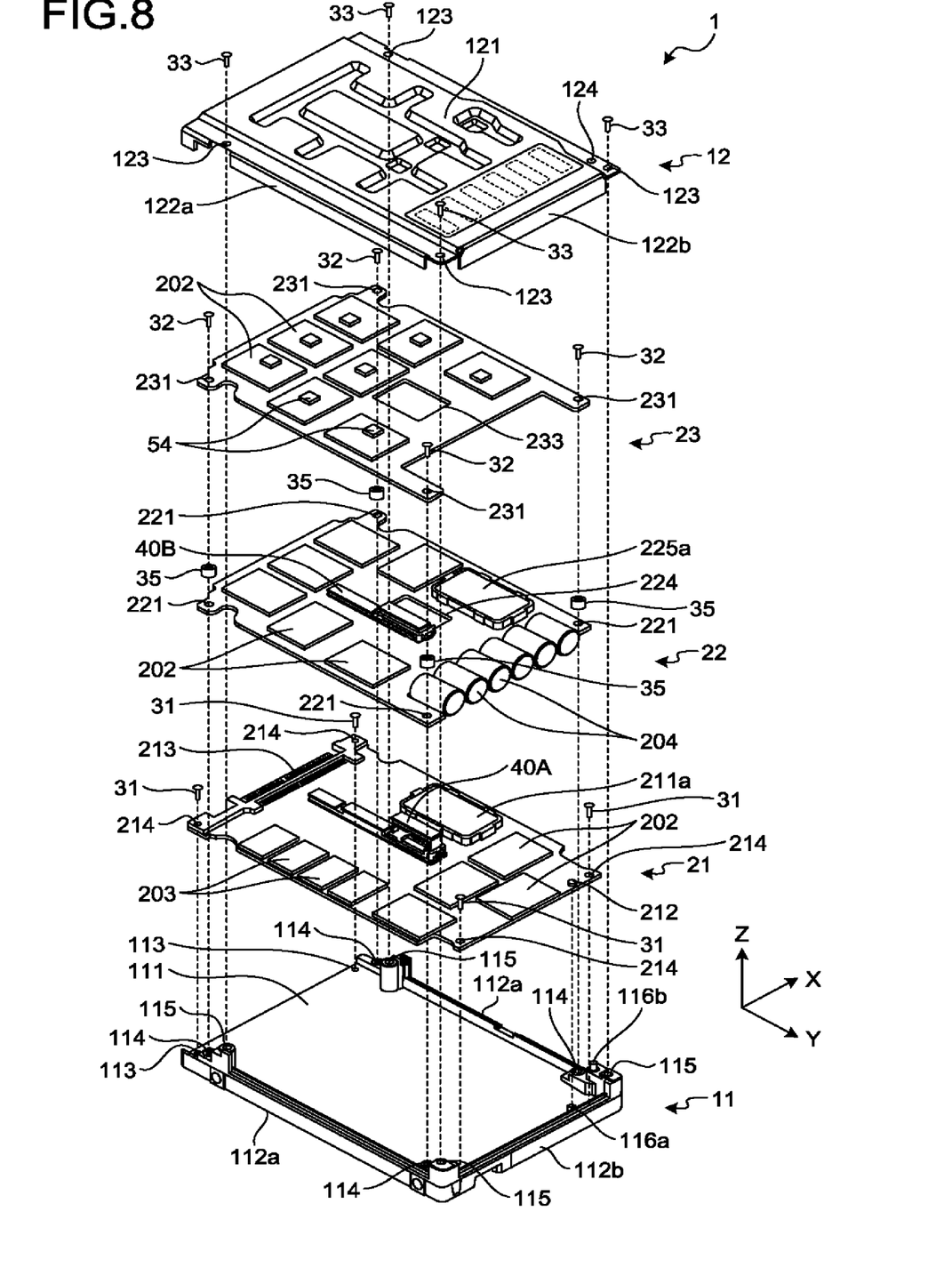
FIG. 8 is an exploded perspective view illustrating an example of an electronic apparatus according to a third embodiment.
Figure 9A:
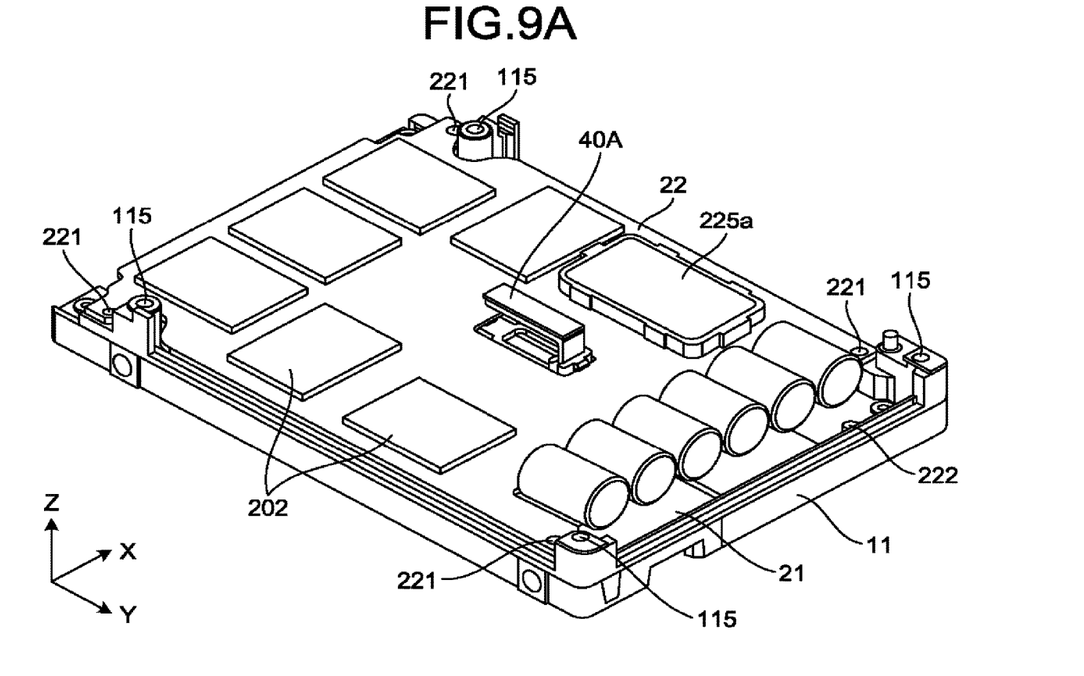
FIGS. 9A and 9B are perspective views illustrating an internal configuration example of the electronic apparatus according to the third embodiment.
Figure 9B:
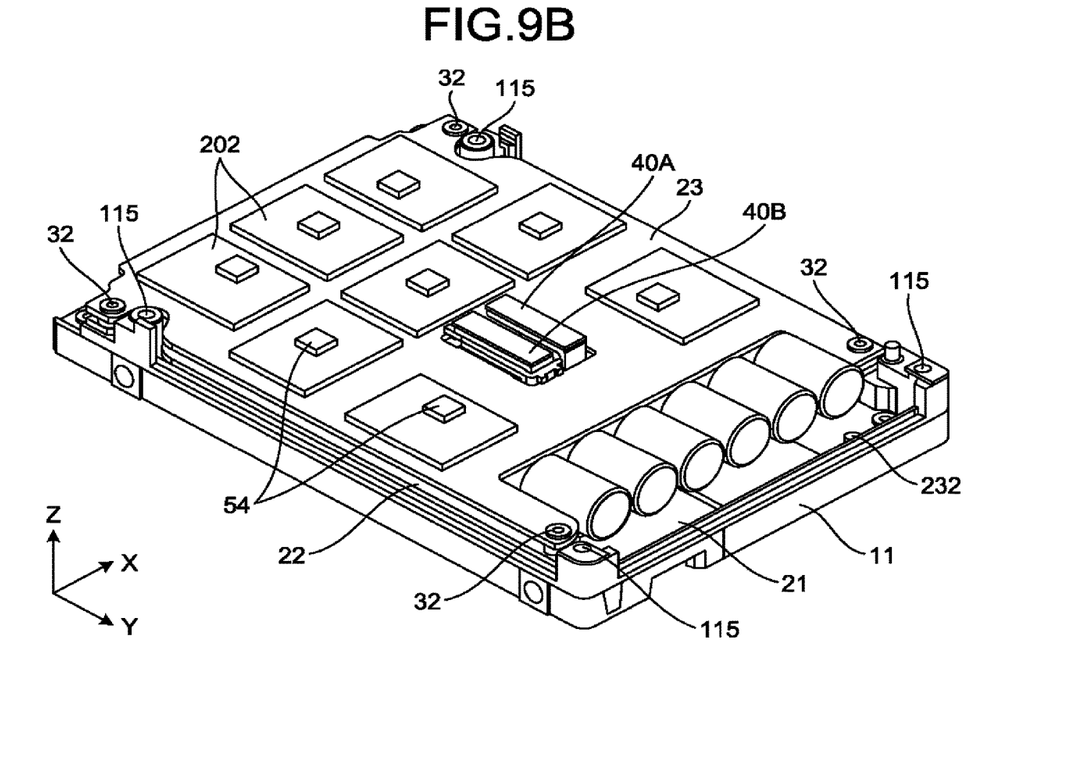
Figure 10A:
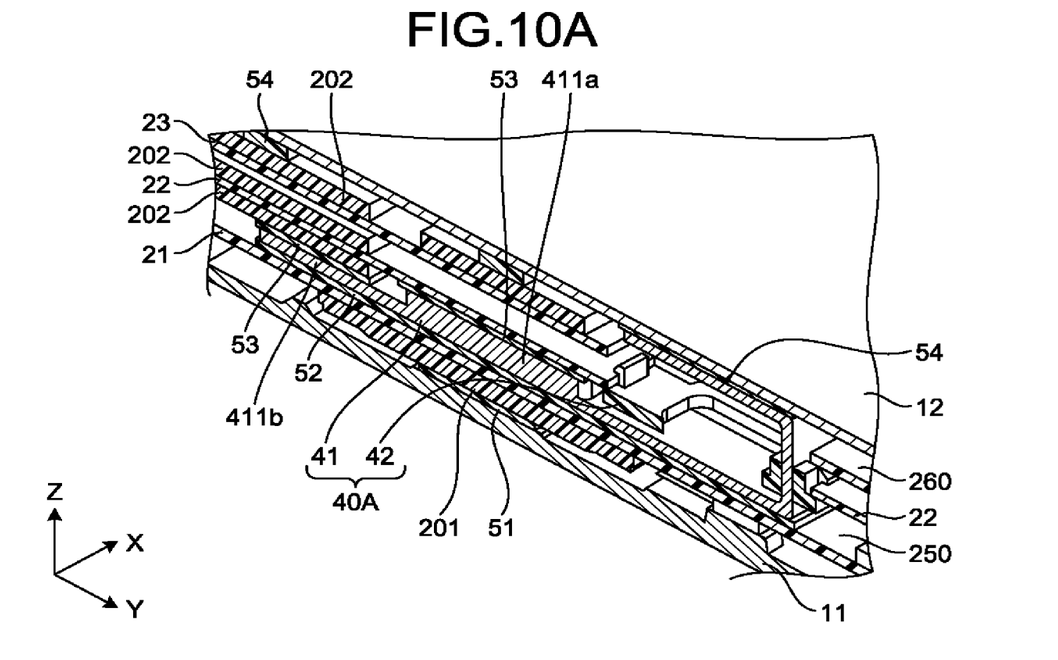
FIGS. 10A and 10E are partial sectional views of the electronic apparatus at arrangement positions of thermal conductive assemblies.
Figure 10B:
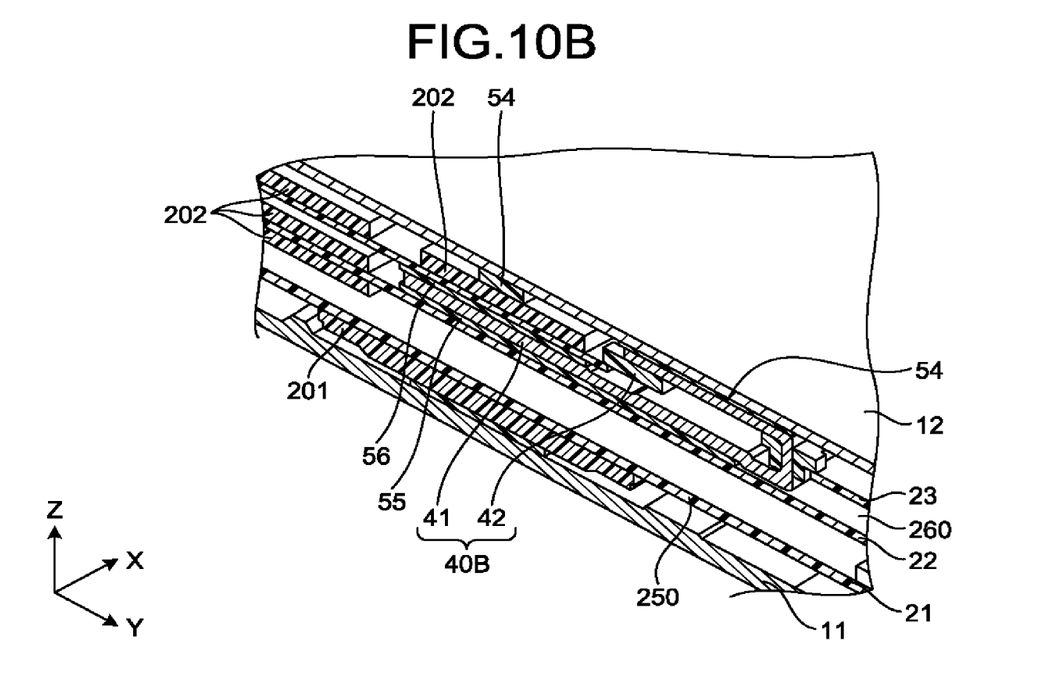
Figure 11A:
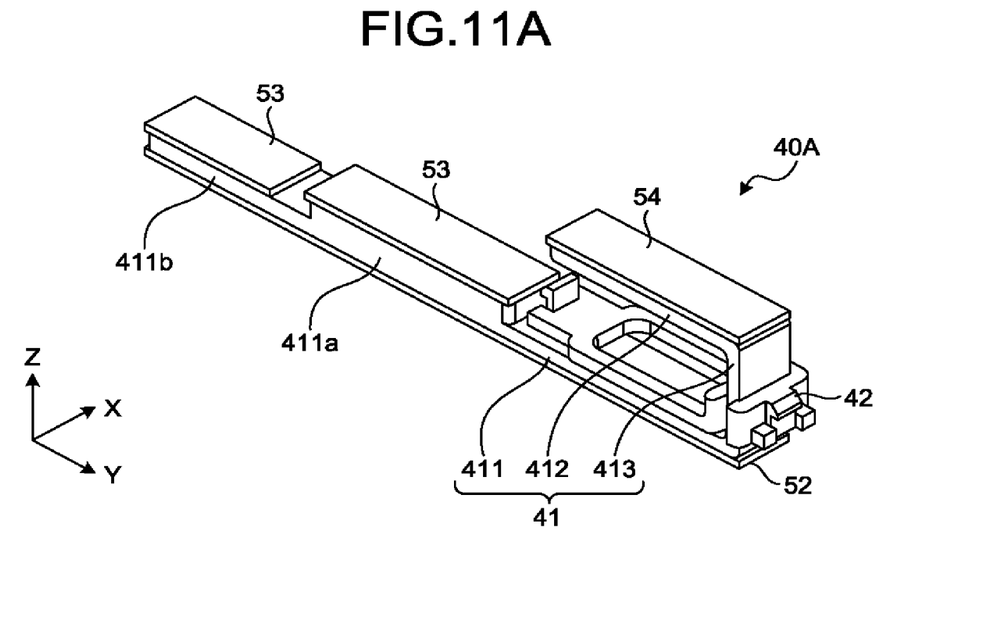
FIGS. 11A and 11B are perspective views illustrating a configuration example of the thermal conductive assemblies used in the third embodiment.
Figure 11B:
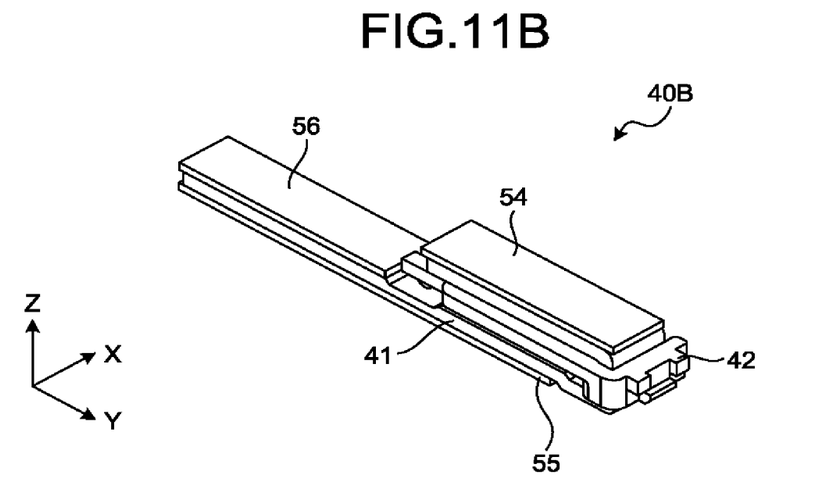
Figure 12A:
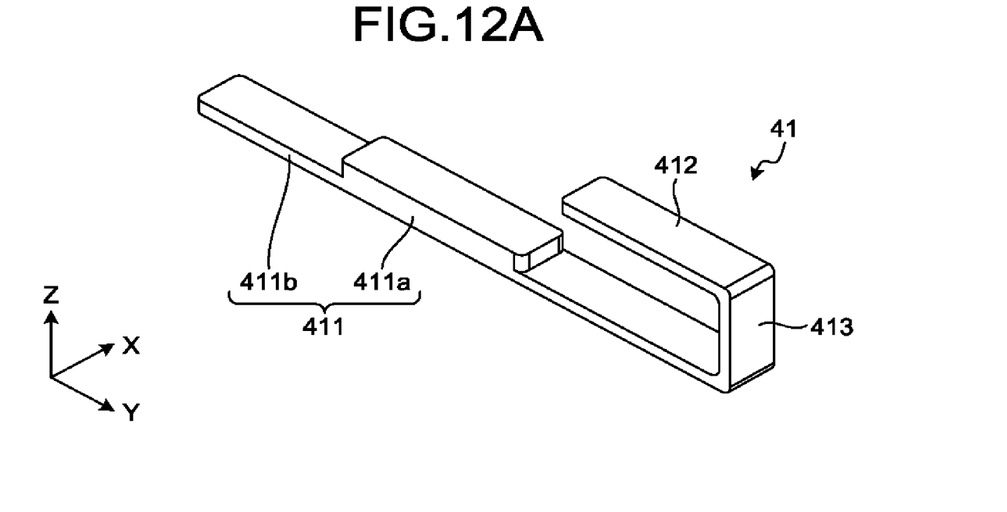
FIGS. 12A and 12B are diagrams illustrating a configuration example of thermal conductive elements used in the third embodiment.
Figure 12B:
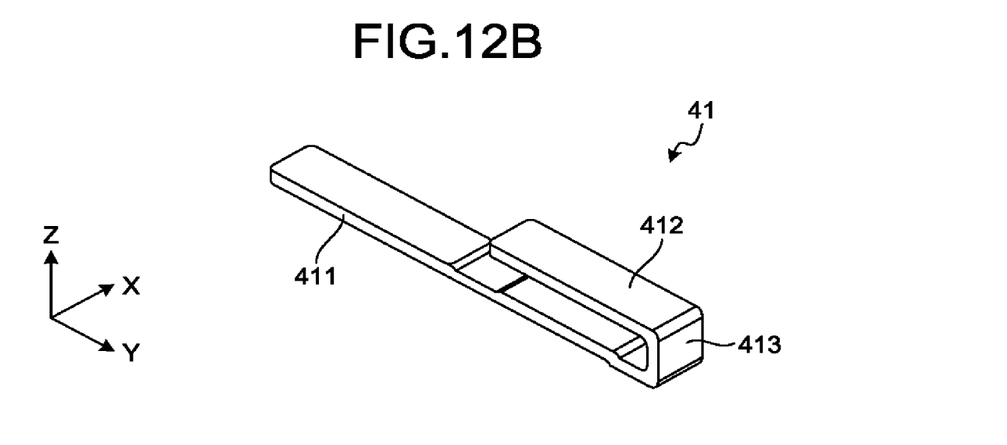

FIG. 8 is an exploded perspective view illustrating an example of an electronic apparatus according to a third embodiment. FIGS. 9A and 9B are perspective views illustrating an internal configuration example of the electronic apparatus according to the third embodiment. FIG. 9A illustrates a state where assembling has been performed up to the board second from the bottom, and FIG. 9B illustrates a state where assembling has been performed up to the board on the uppermost side (i.e., the third from the bottom). FIGS. 10A and 10B are partial sectional views of the electronic apparatus at arrangement positions of thermal conductive assemblies. FIG. 10A is a partial sectional view taken in parallel with the YZ-plane, passing through a thermal conductive assembly 40A described later. FIG. 10B is a partial sectional view taken in parallel with the YZ-plane, passing through a thermal conductive assembly 408 described later. FIGS. 11A and 11B are perspective views illustrating a configuration example of the thermal conductive assemblies used in the third embodiment. FIGS. 12A and 12B are diagrams illustrating a configuration example of thermal conductive elements used in the third embodiment. Here, the constituent elements corresponding to those of the first and second embodiments are denoted by the same reference symbols, and their description will be omitted.

As illustrated in FIG. 5, in the third embodiment, three boards 21 to 23 are accommodated in a housing 10. The boards 21 and 22 have substantially the same structures as those described in the first embodiment. However, the board 22 and the board 23 are structured to be fixed by screws 32 in a jointly fastened state with spacer pieces 35 interposed therebetween. Further, a board-to-board connector 225a is mounted on the upper face of the board 22, to form electrical connection to the board 23.

The board 23 is provided with through holes 231 for inserting the screws 32 therein that are to fix the boards 22 and 23, which are arranged with the spacer pieces 35 interposed therebetween, to the base 11. These through holes 231 are arranged correspondingly to the screw holes 114 of the lateral walls 112a of the base 11. Further, a board-to-board connector (not illustrated) is mounted on the lower face of the board 23, to form electrical connection to the board 22.

Further, in the third embodiment, as illustrated in FIGS. 10A and 10B, as the three hoards 21 to 23 are arranged, inter-board regions 250 and 260 are formed between the board 21 and the board 22 and between the board 22 and the board 23, respectively. Accordingly, two thermal conductive assemblies 40A and 403 are provided to cause heat, which is conducted to the boards 21 to 23 fronting these inter-board regions 250 and 260, to be dissipated to outside from the housing 10.

Thermal conductive assembly 40A connects the upper face of the board 21 and the lower face of the board 22, which front the inter-board region 250, to the cover 12 through thermal interface materials 52 to 54. The thermal conductive assembly 40E connects the upper face of the board 22 and the lower face of the board 23, which front the inter-board region 260, to the cover 12 through thermal interface materials 54 to 56. The board 22 is provided with an opening 224 at a position corresponding to the arrangement position of the thermal conductive assembly 40A. The board 23 is provided with an opening 233 at a position corresponding to the arrangement positions of the thermal conductive assemblies 40A and 40B. Here, in this example, only one opening 233 is formed such that the thermal conductive assemblies 40A and 40E to be provided on the boards 21 and 22 can pass through together. However, an opening for the thermal conductive assembly 40A to pass through and an opening for the thermal conductive assembly 408 to pass through may be separately formed.

Each of the thermal conductive assemblies 40A and 40B is substantially the same as that described in the first embodiment. However, the height of the thermal conductive element 41 differs, depending on the arrangement position. Specifically, as illustrated in FIGS. 11A and 12A, in the thermal conductive assembly 40A, the height of the connecting portion 413 is substantially equal to the distance between the upper face of the board 21 and the lower face of the top wall 121 of the cover 12. Further, as illustrated in FIGS. 11B and 12B, in the thermal conductive assembly 40B, the height of the connecting portion 413 is substantially equal to the distance between the upper face of the board 22 and the louver face of the top wall 121 of the cover 12.

Further, in the thermal conductive assembly 40A, the first contact portion 411 of the thermal conductive element 41 includes two projected portions 411a and 411b different in height. As illustrated in FIG. 10A, the upper face of the projected portion 411a is set in contact with the lower face of the board 22 through a thermal interface material 53. The upper face of the projected portion 411b is set in contact with the lower face of a nonvolatile memory 202 through a thermal interface material 53.

Next, an example of an assembling method of the electronic apparatus 1 described above will be explained, with reference to FIGS. 8 to 10B. Here, the procedures performed until the board 22 is arranged on the base 11 is the same as those described in the first embodiment, and thus their description will be omitted. However, it is the thermal conductive assembly 40A illustrated in FIG. 11A that is to be arranged on the board 21.

After the board 22 is arranged on the base 11, the thermal conductive assembly 40A is attached to the board 22 such that the second contact portion 412 of the thermal conductive element 41 is present at a position corresponding to the opening 224 of the board 22. Thereafter, the board 21 and the board 22 are joined to each other by the board-to-board connectors 211a on the board 21 and the board-to-board connector (not illustrated) on the lower face of the board 22. Here, in the thermal conductive assembly 40A, the lower face of the first contact portion 411 of the thermal conductive element 41 is connected to the upper face of the board 21 through the thermal interface material 52, the upper face of the projected portion 411a is connected to the lower face of the board 22 through one of the thermal interface materials 53, and the upper face of the projected portion 411b is connected to the nonvolatile memory 202 through another of the thermal interface materials 53. This state is illustrated in FIG. 9A.

Thereafter, the thermal conductive assembly 40B is attached to the board 23 such that the second contact portion 412 of the thermal conductive element 41 is present at a position corresponding the opening 233 of the board 23. Thereafter, the board 22 and the board 23 are joined to each other by the board-to-board connectors 225a on the board 22 and the board-to-board connector (not illustrated) on the lower face of the board 23. Here, in the thermal conductive assembly 40B, the lower face of the first contact portion 411 of the thermal conductive element 41 is connected to the upper face of the board 22 through the thermal interface material 55, and the upper face of the first contact portion 411 is connected to the lower face of the board 23 through the thermal interface material 56. Further, as illustrated in FIG. 8, the spacer pieces 35 are arranged at positions corresponding to the arrangement positions of the through holes 221 and 231 between the board 22 and the board 23. In this state, the boards 22 and 23 are fixed to the base 11 by the screws 32 used as fixing means. Specifically, the screws 32 are inserted through the through holes 231 of the board 23, the spacer pieces 35, and the through holes 221 of the board 22, and are fastened into the screw holes 114 of the base 11 to fix the boards 22 and 23. This state is illustrated in FIG. 9B, which illustrates an example where the second contact portions 412 of the thermal conductive assemblies 40A and 408 are arranged side by side in the X-direction.

Thereafter, as illustrated in FIG. 8, the thermal interface materials 54 are stuck to predetermined positions on the upper face of the board 23. For example, the thermal interface materials 54 are stuck to the nonvolatile memories 202 mounted on the upper face of the board 23. Then, while aligning the pin 116a provided on the base 11 to be inserted into the through hole 124 of the cover 12, the cover 12 is put over the base 11. Then, the cover 12 is fixed to the base 11 by fixing means, such as the screws 33. Specifically, the screws 33 are inserted through the through holes 123 provided on the cover 12, and are fastened into the screw holes 115 provided on the lateral walls of the base 11 to fix the cover 12. With the procedures described above, the electronic apparatus is assembled.

As illustrated in FIG. 10A, devices disposed on the lower face of the board 21, such as the controller 201, and devices disposed on the upper face of the board 23, such as some of the nonvolatile memories 202, are respectively connected to the base 11 and the cover through the thermal interface materials 51 and 54. Accordingly, even if the amount of heat generated from the devices is large, the heat can be dissipated through the thermal interface materials 51 and 54, and to outside from the housing 10.

Further, the thermal conductive assembly 40A thermally connecting the faces of the boards 21 and 22, which front the inter-board region 250, to the cover 12 of the housing 10 is provided. The thermal conductive assembly 40B thermally connecting the faces of the boards 22 and 23, which front the inter-board region 260, to the cover 12 of the housing 10 is provided. As a result, heat conducted to the boards 21 to 23, which front the inter-board regions 250 and 260, is transferred through the thermal conductive assemblies 40A and 40B to the cover 12 of the housing 10, and is dissipated to outside from the housing 10.

In the third embodiment, an effect substantially the same as that of the first embodiment can also be obtained.

In the above description, a case is illustrated where the thermal conductive assemblies 40A and 40B connect the boards 21 to 23, which front the inter-board regions 250 and 260, to the cover 12. However, depending on the arrangement states of devices on the boards 21 to 23, the thermal conductive assemblies 40 may connect the boards 21 to 23, which front the inter-board regions 250 and 260, to the base 11.

Further, in the above description, a case is illustrated where the lower faces of the first contact portions 411 are set in contact with the boards 21 and 22 through the thermal interface materials 52 and 55. However, the lower face of a first contact portion 411 may be set in contact with a device, such as one of the nonvolatile memories 202.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
    a first hoard;
    a second board;
    a housing that accommodates the first board and the second board; and
    a first thermal conductive assembly that connects a face of the first board, the face of the first board fronting a region between the first board and the second board, to a first face of the housing or a second face of the housing, the first face being opposed to the first board, the second face being opposed to the second board.

2. The electronic apparatus according to claim 1, wherein the first thermal conductive assembly has a hook shape.

3. The electronic apparatus according to claim 2, wherein the first thermal conductive assembly includes a thermal conductive element that includes a first contact portion set in contact with the first board in the region between the first hoard and the second board, a second contact portion set in contact with the first face of the housing or the second face of the housing, and a connecting portion connecting the first contact portion to the second contact portion.

4. The electronic apparatus according to claim 3, wherein the second board includes an opening at a position corresponding to an arrangement position of the second contact portion.

5. The electronic apparatus according to claim 4, wherein the first thermal conductive assembly further includes a fixing part for fixing the thermal conductive element to the opening of the second board.

6. The electronic apparatus according to claim 1, wherein the first board includes a device that generates heat, and the first thermal conductive assembly is arranged correspondingly to a position of the device that generates heat.

7. The electronic apparatus according to claim 6, wherein the first board or the second board further includes a nonvolatile memory,
the device that generates heat is a controller for controlling the nonvolatile memory, and
the first thermal conductive assembly is arranged on a reverse side of a mounting position of the controller on the first board.

8. The electronic apparatus according to claim 6, wherein the first thermal conductive assembly is set in contact with the device that generates heat.

9. The electronic apparatus according to claim 3, wherein the first contact portion is set in contact with the second board.

10. The electronic apparatus according to claim 3, wherein
the second board includes a device that generates heat, and
the first contact portion is set in contact with the device.

11. The electronic apparatus according to claim 3, wherein
the first board includes a first device that generates heat,
the second board includes a second device that generates heat, and
the first contact portion is set in contact with the first device and the second device.

12. The electronic apparatus according to claim 1, further comprising:
a third board; and
a second thermal conductive assembly that connects a face of the third board, the face of the third board fronting a region between the first board and the third board; to the first face of the housing or the second face of the housing.

13. The electronic apparatus according to claim 1, wherein the first thermal conductive assembly includes aluminum, copper, or a heat pipe.

* * * * *